United States Patent [19]
Matsuoka et al.

[11] Patent Number: 5,322,589
[45] Date of Patent: Jun. 21, 1994

[54] PROCESS AND APPARATUS FOR RECRYSTALLIZATION OF SEMICONDUCTOR LAYER

[75] Inventors: Hidesato Matsuoka, Kawasaki; Kazuo Hashimi, Yokohama, both of Japan

[73] Assignee: Fujitsu Limited, Kawasaki, Japan

[21] Appl. No.: 50,738

[22] Filed: Apr. 21, 1993

Related U.S. Application Data

[63] Continuation of Ser. No. 773,996, Oct. 9, 1991, abandoned, which is a continuation of Ser. No. 476,902, Feb. 8, 1990, abandoned.

[30] Foreign Application Priority Data

Feb. 9, 1989 [JP] Japan .................................. 1-30423
Dec. 25, 1989 [JP] Japan ................................ 1-337530

[51] Int. Cl.$^5$ .............................................. C30B 1/08
[52] U.S. Cl. .................................... 437/173; 117/44; 117/933
[58] Field of Search ............... 148/DIG. 46, DIG. 93; 156/620.72, DIG. 64, DIG. 72, DIG. 80, DIG. 88, DIG. 102; 437/173

[56] References Cited

U.S. PATENT DOCUMENTS

| | | | |
|---|---|---|---|
| 3,349,174 | 10/1967 | Warshauer | 156/DIG. 102 |
| 3,926,682 | 12/1975 | Shimada et al. | 437/173 |
| 4,382,186 | 5/1983 | Denholm et al. | 156/DIG. 102 |
| 4,388,145 | 6/1983 | Hawkins et al. | 156/620.71 |
| 4,444,620 | 4/1984 | Kovacs et al. | 156/620.71 |
| 4,592,799 | 6/1986 | Hayafuji | 156/620.72 |
| 4,662,949 | 5/1987 | Inoue et al. | 156/620.71 |
| 4,664,940 | 5/1987 | Bensoussan et al. | 437/173 |

FOREIGN PATENT DOCUMENTS

| | | |
|---|---|---|
| 2723915 | 5/1977 | Fed. Rep. of Germany . |
| 0208828 | 10/1985 | Japan .................. 437/173 |
| 81/00789 | 3/1981 | PCT Int'l Appl. . |

OTHER PUBLICATIONS

*Heteroepitaxy Of Deposited Amorphous Layer By Pulsed Electron-Beam Irradiation;* Lau et al; pp. 235-237.
Patent Abstracts of Japan, vol. 7, No. 247 (247 (E-208) [1392], 2nd Nov. 1983; & JP-A-58 135 629 (Fujitsu K.K.) Dec. 8, 1983.
Journal of the Electrochemical Society, vol. 133, No. 7, Jul. 1986, pp. 1485-1488, Sakurai, "Focused lamp zone melting recrystallization of silicon on insulating substrates".

*Primary Examiner*—Robert Kunemund
*Assistant Examiner*—Felisa Garrett
*Attorney, Agent, or Firm*—Armstrong, Westerman, Hattori, McLeland & Naughton

[57] ABSTRACT

A process for recrystallizing a semiconductor layer including the steps of forming a polycrystalline or amorphous semiconductor layer on a substrate and scanning energy beam on the semiconductor layer, wherein the energy beam is vibrated substantially in parallel to the direction of advance of the scanning of the energy beam. For carrying out the process, the apparatus includes a sample stage for holding a sample having a polycrystalline or amorphous semiconductor layer, an energy beam source for generating energy beam, a scanning means for scanning the energy beam on the semiconductor layer, and a beam-vibrating means for vibrating the energy beam substantially in parallel to the direction of advance of the scanning of the energy beam.

11 Claims, 9 Drawing Sheets

1 Hz

10 Hz

100 Hz

1 KHz

10 KHz

PROCESS AND APPARATUS FOR RECRYSTALLIZATION OF SEMICONDUCTOR LAYER

This application is a continuation of application Ser. No. 07/773,996 filed Oct. 9, 1991 now abandoned; which is a continuation of parent application Ser. No. 07/476,902 filed Feb. 8, 1990, now abandoned.

BACKGROUND OF THE INVENTION (1) Field of the Invention

The present invention relates to a process and apparatus for the preparation of a semiconductor device. More particularly, the present invention relates to a process and apparatus for recrystallizing polycrystalline or amorphous silicon.

(2) Description of the Related Art

In the semiconductor industry, a three-dimensional structure has attracted attention as a means of increasing the degree of integration and the operating speed, and as a means of realizing this structure, there has been proposed an SOI (semiconductor-on-insulator) technique of forming a recrystallized silicon layer capable of forming an element thereon on an insulating film.

In this SOI technique, the recrystallized silicon is formed by melting and recrystallizing polycrystalline silicon deposited on an insulating film by energy beams, but often the melted silicon is peeled from the insulating film. Accordingly, the development of a process for eliminating this defect is desired.

When a substrate having an SOI structure, which is used for a three-dimensional IC or the like, is prepared, an interlaminar insulating film, for example, silicon dioxide ($SiO_2$), is formed on a silicon (Si) substrate having semiconductor elements formed thereon, a polycrystalline Si layer is deposited on this $SiO_2$ film by the chemical vapor deposition (CVD) method, and energy beams, for example, laser beams, are vertically scanned over the polycrystalline Si layer so that the end portions of the beam-irradiated regions are overlapped, whereby the polycrystalline silicon is melted and recrystallized in sequence and a recrystallized Si layer having a single crystal region covering a broad area sufficient to form semiconductor elements thereon is formed on the $SiO_2$ film.

In the conventional technique, the incident angle of the laser beams having a predetermined beam spot diameter to the substrate is fixed, and scanning is carried out in sequence at a predetermined constant speed.

In the conventional beam annealing method and apparatus where the polycrystalline Si layer is melted and converted to a single crystal in sequence, where the recrystallization is carried out under the conditions of an efficient melting of the polycrystalline Si and giving an efficient treatment, for example, a power density of $10^6$ to $10^7$ $W/cm^2$ and a scanning speed of about 2 to about 3 mm/sec, a peeling of the melted Si from the surface of the $SiO_2$ film often occurs, whereby holes exposing the $SiO_2$ film are formed in the Si surface at a high density and only a recrystallized Si layer that cannot be practically used is formed.

According to the conventional technique, this peeling is controlled by reducing the beam intensity, i.e., the power density of laser beams, but this conventional method is defective in that the melting width is narrowed by a reduction of the power density, with the result that the crystal quality is lowered and the treatment time is greatly prolonged.

SUMMARY OF THE INVENTION

Therefore, an object of the present invention is to provide a process and apparatus for the preparation of a semiconductor device in which the peeling of a melted semiconductor from an insulating film can be controlled without a reduction of the treatment efficiency, and a recrystallized layer having a good quality can be formed over a broad region on the insulating film at a high treatment efficiency.

In accordance with the present invention, this object can be attained by a process for the preparation of a semiconductor device comprising scanning energy beams on a polycrystalline or amorphous semiconductor on an insulating body to convert the polycrystalline or amorphous semiconductor to a single crystal semiconductor, wherein the scanning is carried out by applying vibrations substantially in parallel to the direction of advance of the scanning of the energy beams.

According to the present invention, there is also provided an apparatus to be used for the preparation of a semiconductor device, comprising a sample stage for holding a sample having a polycrystalline or amorphous semiconductor formed on an insulating body, and an energy beam source for generating energy beams, wherein the apparatus is constructed so that the sample-holding portion on the sample stage is irradiated with the energy beams generated from the energy beam source, and the energy beams are scanned on the sample-holding portion, and a beam-vibrating means for vibrating the energy beams substantially in parallel to the direction of advance of the scanning of the energy beams is disposed between the energy beam source and the portion to be irradiated with the energy beams on the sample stage.

In the present invention, laser beams, electron beams and the like can be used as the energy beams.

Where laser beams are used as the energy beams, preferably the power density of the laser beams is adjusted to at least $10^6$ $W/cm^2$, the thickness of the polycrystalline semiconductor is adjusted to 1000 to 5000 Å, and the frequency of the vibrations of the laser beams is adjusted to 290 Hz to 180 KHz. Furthermore, preferably the amplitude of the vibrations of the laser beams is within the range of $\pm(20$ to $50)$ $\mu m$ relative to the central position.

As the beam-vibrating means for vibrating the energy beams, an acoustic optical modular can be used in the case of laser beams and a deflecting coil can be used in the case of electron beams.

In the present invention, the direction of the vibration of the energy beams is substantially in parallel to the direction of advance of the scanning, and the deviation from the direction of advance of the scanning may be within 5°.

BRIEF DESCRIPTION OF THE DRAWINGS

FIGS. 3a through 3f are plane diagrams illustrating the recrystallization state in one embodiment of the present invention, in which FIG. 3a shows the case where vibrations are not given, FIG. 3b shows the case where the frequency of the given vibrations is 1 Hz, FIG. 3c shows the case where the frequency of the given vibrations is 10 Hz, FIG. 3d shows the case where the frequency of the given vibrations is 100 Hz, FIG. 3e shows the case where the frequency of the given vibrations is 1 KHz, and FIG. 3f shows the case where the frequency of the given vibrations is 10 KHz;

DETAILED DESCRIPTION OF THE PREFERRED EMBODIMENTS

In the process of the present invention, when a polycrystalline or amorphous semiconductor on an insulating body is melted and recrystallized in sequence by scanning energy beams, vibrations substantially in parallel to the direction of advance of the scanning are given to the energy beams. It is considered that the application of these vibrations increases the wetting property of the melted semiconductor to the insulating film and controls the peeling of the semiconductor.

Furthermore, the heterogeneous heating by a peeling of the semiconductor is controlled, and therefore, a single crystal layer having a good quality can be prepared over a broad range and in a desired state.

The vibrations can be realized by an apparatus provided with beam-vibrating means, such as an acoustic optical element or a deflecting coil, whereby high power density energy beams can be used at a high efficiency, and a good-quality recrystallized semiconductor layer free of holes formed by a peeling of the melted semiconductor can be formed.

The optimum vibration frequency can be selected relative to the thickness of the polycrystalline Si layer, the power density of the energy beams, and the scanning speed. From the results of experiments made by the inventors it was found that, if the power density of laser beams is at least $10^6$ W/cm$^2$ and the thickness of the polycrystalline Si layer is 1000 to 5000 Å, at a practical beam scanning speed of 2.5 to 100 mm/sec, the frequency of the vibrations given to the laser beams is preferably within the range of from 290 Hz to 180 KHz. Furthermore, it was found that preferably the amplitude of the vibrations of the laser beams is within $\pm(20$ to 50) $\mu$m relative to the central position.

The present invention will now be described in detail with reference to the embodiments illustrated in the accompanying drawings.

Figure 1:
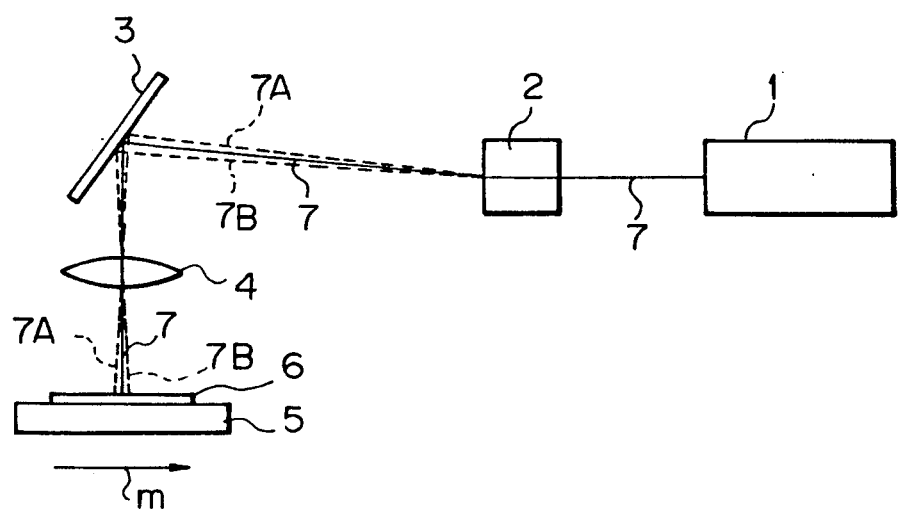
FIG. 1 is a sectional diagram illustrating an embodiment of the apparatus of the present invention.
Figure 2:
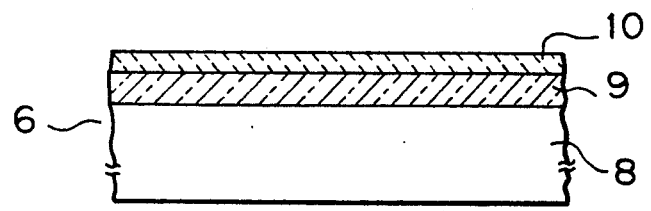
FIG. 2 is a sectional diagram illustrating a substrate used in one embodiment of the present invention.

FIG. 1 is a sectional diagram illustrating one embodiment of the apparatus of the present invention where, for example, an argon (Ar) ion laser having a wavelength of 488 nm is used. In the figure, 1 represents a laser oscillator, 2 an acoustic optical element giving vibrations to laser beams, 3 a mirror, 4 an image-forming lens, 5 a sample stage provided with a mechanism for X-Y movement, 6 a sample to be treated, 7A a laser beam obtained when the displacement by vibrations is 0, 7A (chain line) a laser beam obtained in the case of a negative maximum displacement, and 7B (chain line) a laser beam obtained in the case of a positive maximum displacement. When a recrystallized Si layer, i.e., an SOI layer, is formed on an insulating film according to the process of the present invention, as shown in FIG. 2, an SiO$_2$ film 9 having a thickness of about 1 $\mu$m is formed on an Si substrate 8 by thermal oxidation and a polycrystalline Si layer 10 having a thickness of about 5000 Å is deposited on this SiO$_2$ film 9 by the CVD method. The obtained substrate is used as the starting substrate to be treated.

Figure 5:
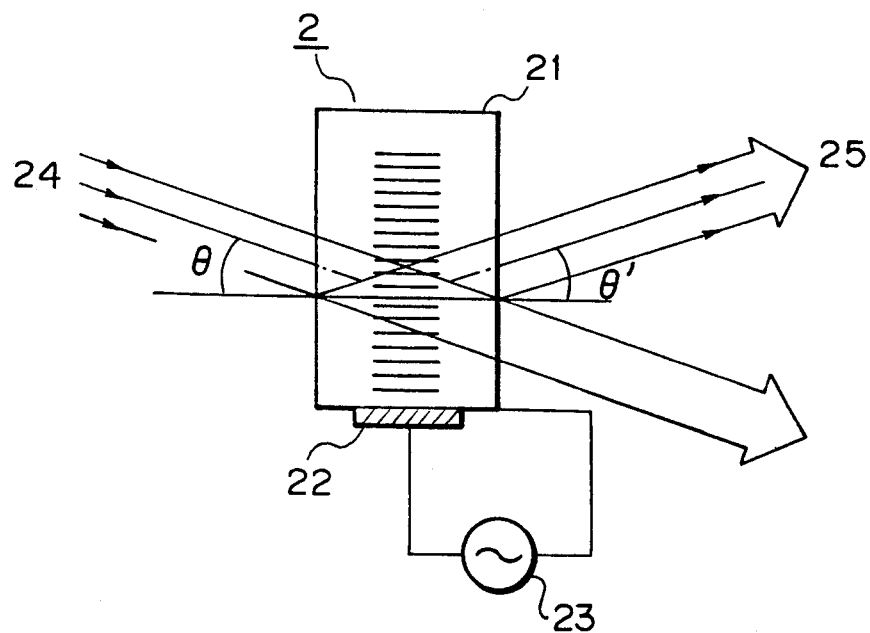
FIG. 5 is a sectional diagram illustrating an acoustic optical element.

In the acoustic optical element 2, as shown in FIG. 5, a pressure transducer 22 is connected to an acoustic optical medium 21 such as TeO$_2$, and a supersonic wave drive voltage 23 is applied to this pressure transducer 22 to generate a compressional wave of the supersonic wave in the acoustic optical medium 21, whereby light 24 is diffracted. By changing the supersonic wave drive voltage 23 at a predetermined frequency, the distribution of the compressional wave of the supersonic wave in the acoustic optical medium 21 is changed, whereby the direction of diffracted light 25 is changed.

In the process according to one embodiment of the present invention, the apparatus shown in FIG. 1 is used, and the laser beam 7 having a spot diameter of 20 $\mu$m is applied substantially vertically to the substrate 6 to be treated and placed on the sample stage 5, as shown in FIG. 2, while vibrating the laser beam 7, and the surface of the substrate 6 is scanned in sequence by the laser beam 7 by moving the stage 5 in directions X and Y. At this operation, the power density of the laser beam is $10^6$ to $10^7$ W/cm$^2$, and the scanning speed of the beam is about 2.5 mm/sec.

The direction of the vibration given to the laser beam 7 by the acoustic optical modular 2 is substantially proportional to the direction of advance of the scanning by the laser beam 7. Namely, the direction of the vibration substantially overlaps the direction of advance of the scanning. The amplitude of this vibration is fixed within the range of $\pm(20$ to 50) $\mu$m, for example, $\pm 40$ $\mu$m, relative to the central position and the recrystallization is carried out while changing the frequency of the vibration to 0 Hz, 1 Hz, 10 Hz, 100 Hz, 1 KHz and 10 KHz. Since this embodiment is carried out for determining the frequency of the frequency for obtaining a much better single crystal layer by the recrystallization, to facilitate the microscopic judgement, the pitch of the beam scanning is adjusted to about 40 $\mu$m to broaden the space of the beam scanning regions.

Figure 3A:
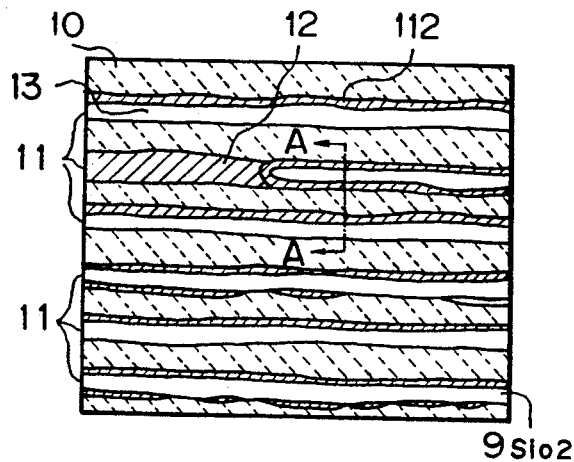
Figure 4A:
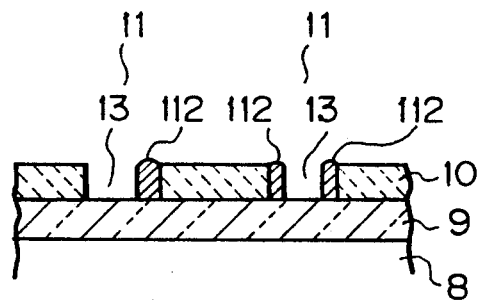
FIGS. 4a through 4f are diagrams showing the section seen in the direction A—A, and correspond to FIGS. 3a through 3f, respectively.

The recrystallization states of the polycrystal Si layer corresponding to the above-mentioned frequencies are shown by diagrams of microscopic images of about 100 magnifications in plane views of FIG. 3 and sectional views of FIG. 4, seen from the direction of A—A.

Where the vibration frequency is 0, i.e., no vibration is given, as shown in FIGS. 3a and 4a, a part of melted Si of the beam scanning region 11 is recrystallized while adhering closely to the SiO$_2$ film 9 located below, and a normal recrystallized Si layer 12 is formed. Most of the melted Si in the scanning region 11, however, is peeled from the SiO$_2$ film 9 located below and is attracted and deposited as a recrystallized Si aggregate 112 onto the side face portion of a polycrystalline Si layer 10, which is not melted but acts as a wall defining the scanning region 11. This peeled portion 13 exposing the SiO$_2$ film 9 located below in the majority of the scanning region 11 is present at some length along the scanning region 11. Note, this state is not applicable to practical use.

Figure 3B:
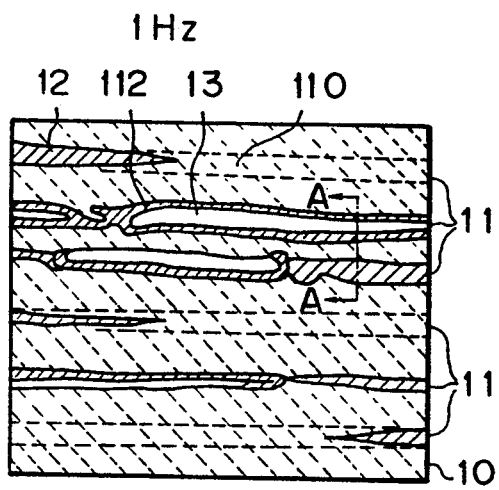
Figure 4B:
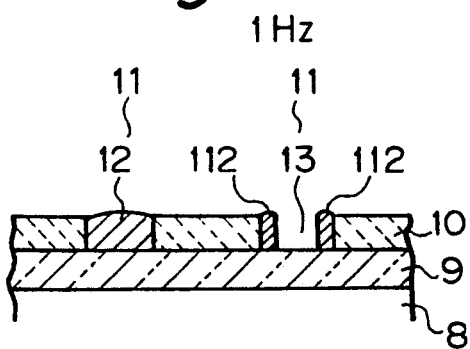

FIGS. 3b and 4b show the state observed when the recrystallization is carried out while giving a vibration at a frequency of 1 Hz. The area of the region where the recrystallized Si layer 12 is increased, compared with the area of the recrystallized Si layer 12 formed when no vibration is given, and the length of the peeled portion 13 formed by generation of the recrystallized Si aggregate 112 is reduced to about 200 to about 300 μm. Nevertheless, a region of polycrystalline Si left in the non-recrystallized state is formed in the scanning region.

Figure 3C:
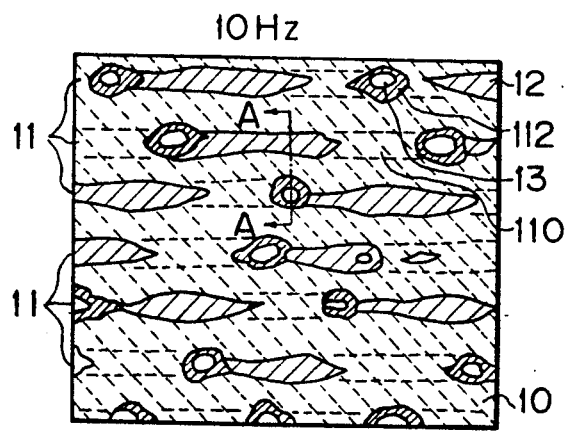
Figure 4C:
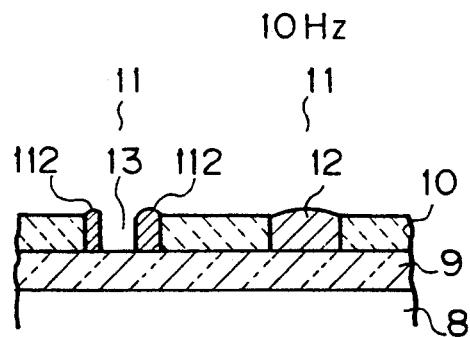

FIGS. 3c and 4c show the case where the recrystallization is carried out while giving a vibration at a frequency of 10 Hz. In this case, the length of the peeled portion 13 formed by generation of the recrystallized Si aggregate 112 is shortened to less than about 30 μm, and the area of the region where the normal recrystallized Si layer 12 is formed is further increased. Nevertheless, a recrystallized polycrystalline Si region is present along a length of about 20 to about 30 μm in the normal recrystallized Si layer 12.

Figure 3D:
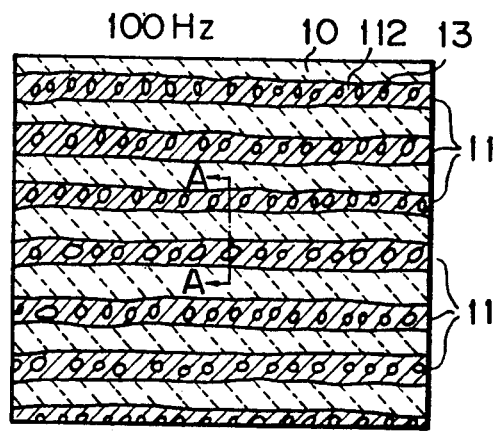
Figure 4D:
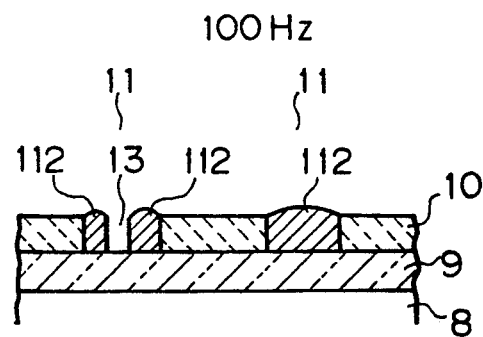

FIGS. 3d and 4d illustrate the case where the recrystallization is carried out while giving a vibration at 100 Hz. In this case, a continuous recrystallized Si layer 12 is formed completely continuously in the entire scanning region, but very fine hole-like peeled portions 13 are continuously formed at substantially equal intervals in the recrystallized Si layer 12.

Figure 3E:
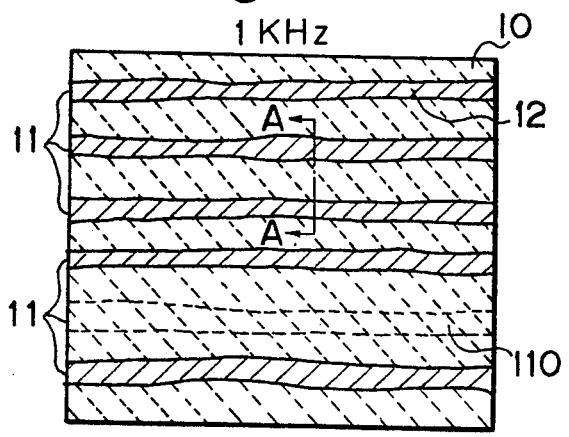
Figure 3D:
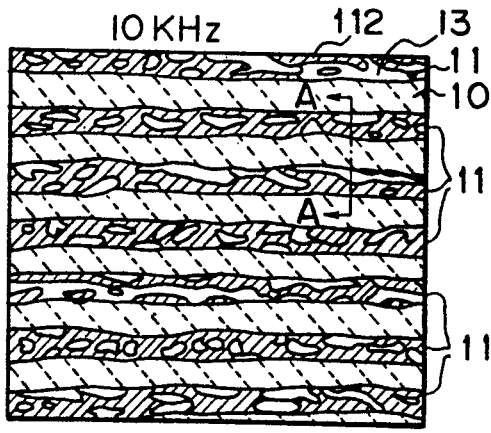
Figure 4E:
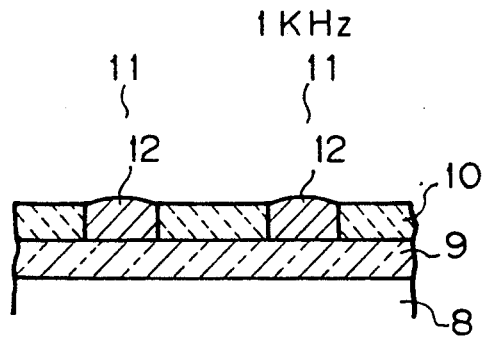

FIGS. 3e and 4e illustrate the case where the recrystallization is carried out while giving a vibration at 1 KHz. In this case, a portion of the polycrystalline Si region 110 left in the nonrecrystallized state is present at a part of the scanning region 11, but a recrystallized Si layer 12 is substantially completely formed in the entire scanning region 11.

This state is maintained when vibrations having a frequency of up to about 5 KHz are given, although not specifically illustrated in the drawings.

Figure 4F:
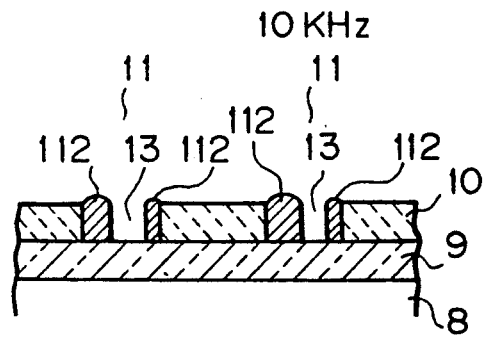

FIGS. 3f and 4f illustrate the case where the recrystallization is carried out while giving a vibration at 10 KHz. In this case, an irregular peeling of the melted Si in large quantities occurs, and peeled portions 13 having an irregular shape are formed at a high density throughout the scanning region 11.

From the foregoing results, it is understood that, in the above-mentioned embodiment, if a vibration having a frequency of about 1 KHz is given to the laser beam in parallel to the direction of advance of the laser beam, peeling is substantially completely controlled by the beam oscillation effect and a good single crystal Si is obtained. The vibration direction of the energy beam is substantially in parallel to the direction of advance of the scanning, but good results are obtained if the deviation from the direction of advance of the scanning is within 5°. Note, if the deviation angle exceeds about 5°, the above-mentioned effect cannot be obtained.

The results of the measurement of the relationship between the vibration frequency of the laser and the average defect length ratio, i.e., the average proportion of the defect portion not converted to a single crystal in the scanning region, are observed when the thickness of the polycrystalline Si layer, the scanning speed, and the power density are changed.

If the thickness of the polycrystalline Si layer is too small, peeling cannot be controlled, and the thickness should be at least about 1000 Å. Where the layer of Si converted to a single crystal is used for formation of a channel such as MIS FET, the thickness should be controlled to up to 5000 Å, to obtain a high operation speed.

If the scanning speed is low, the time required for the entire conversion to a single crystal becomes long and the manufacturing efficiency is reduced. Accordingly, the scanning speed should be at least about 2.5 mm/sec. If the scanning speed is too high, a problem such as mechanical vibration of the sample stage-moving mechanism arises. Accordingly, the scanning speed should be controlled to up to about 100 mm/sec.

The power density should be at least $10^6$ W/cm$^2$. From the results of the measurement, it was found that, even if the power density is elevated to about $10^7$ W/cm$^2$, the relationship between the vibration frequency of the laser beam and the average defect length ratio is not substantially changed. In the results described hereinafter, the power density of the laser beam is $10^6$ to $10^7$ W/cm$^2$.

Figure 6:
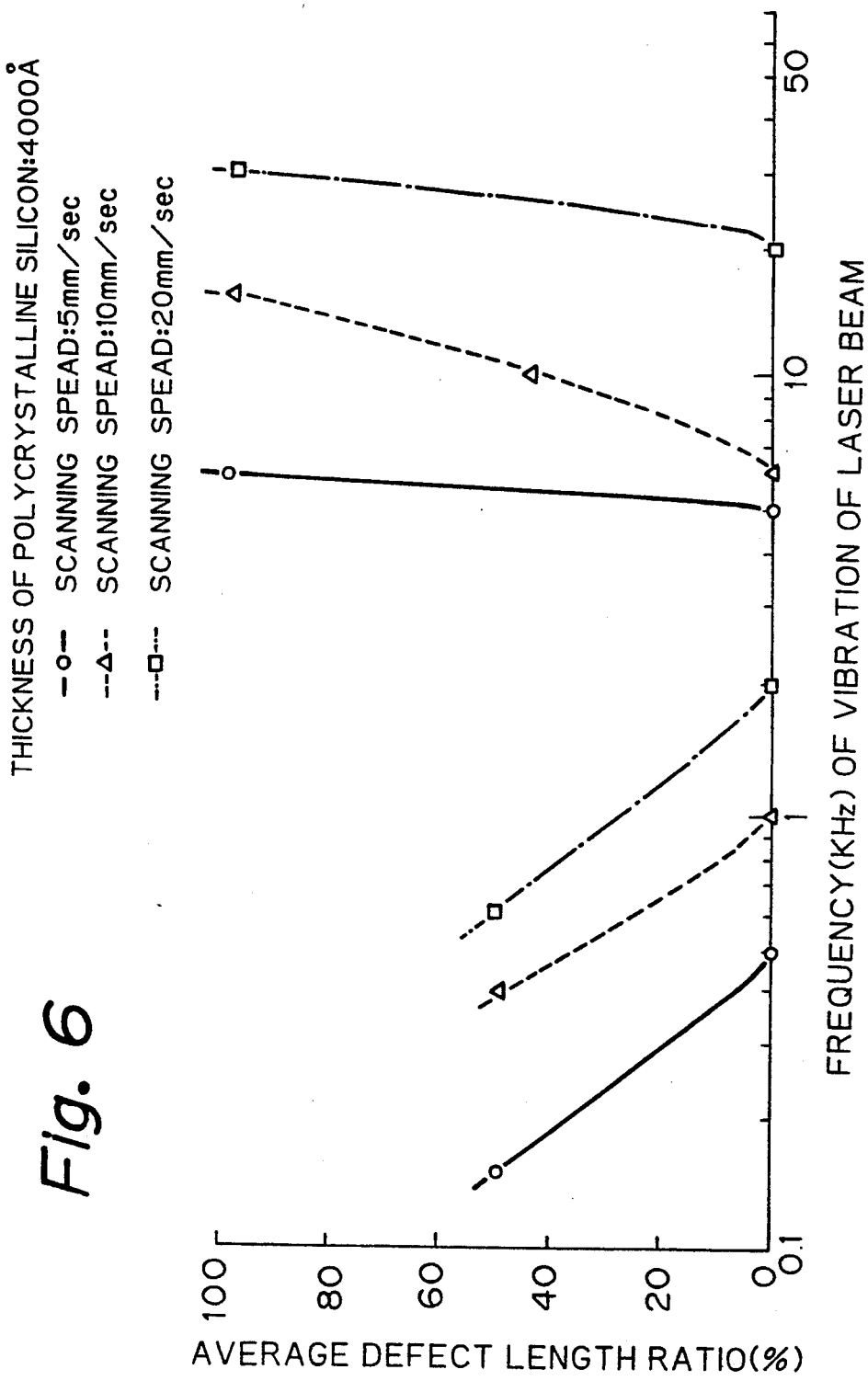
FIGS. 6, 7 and 8 are diagrams illustrating a relationship between the frequency of the vibrations of laser beams and the average defect length ratio.

FIG. 6 is a diagram illustrating the relationship between the vibration frequency of the laser beam and the average defect length ratio, observed when the thickness of polycrystalline silicon is adjusted to 4000 Å. The range of the frequency at which the polycrystal is converted to a single crystal throughout the scanning region and the average defect length ratio is 0, is changed according to the scanning speed of the laser beam. As the scanning speed is increased, the frequency range at which the average defect length ratio is 0 shifts to a high frequency side. For example, if the scanning speed is 5 mm/sec, the frequency range at which the average defect length ratio is 0 is from 500 Hz to 5 KHz. If the scanning speed is 20 mm/sec, this frequency range is from 2 KHz to 20 KHz.

Figure 7:
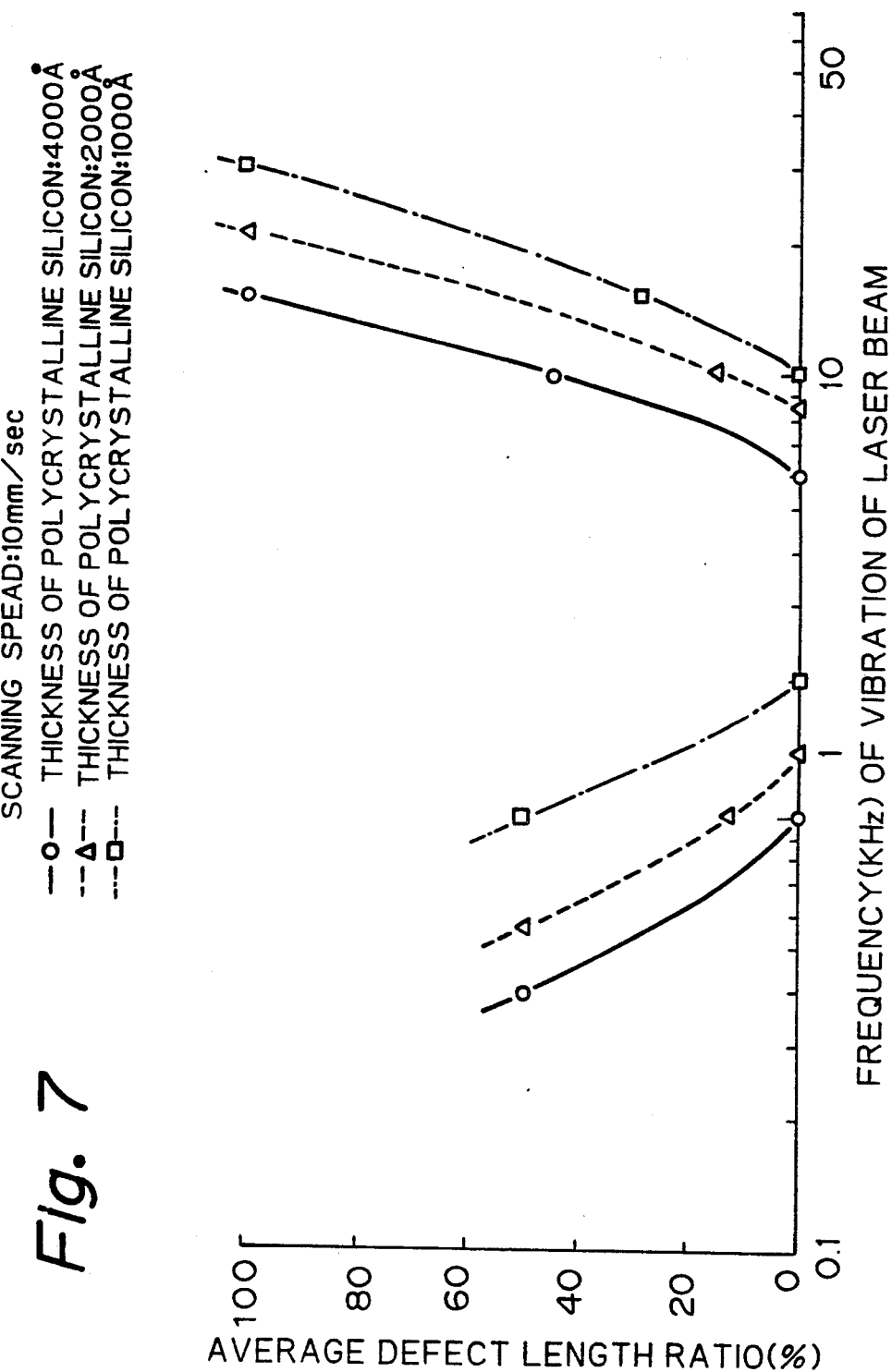

FIG. 7 is a diagram illustrating the relationship between the vibration frequency of the laser beam and the average defect length ratio, observed when the scanning speed of the laser beam is adjusted to 10 mm/sec. The frequency range at which the average defect length ratio is 0 is changed according to the thickness of polycrystalline silicon. As the thickness of polycrystalline silicon is reduced, the frequency range where the average defect length ratio is 0 shifts to a high frequency side. For example, if the thickness of polycrystalline silicon is 1000 Å, the frequency range at which the average defect length ratio is 0 is from 2 KHz to 10 KHz.

As the scanning speed of the laser beam is low and the thickness of polycrystalline silicon is large, the frequency range at which the average defect length ratio is 0 shifts to a low frequency side, and as the scanning speed is high and the thickness of polycrystalline silicon is small, the frequency range at which the average defect length ratio is 0 shifts to a high frequency side.

Figure 8:
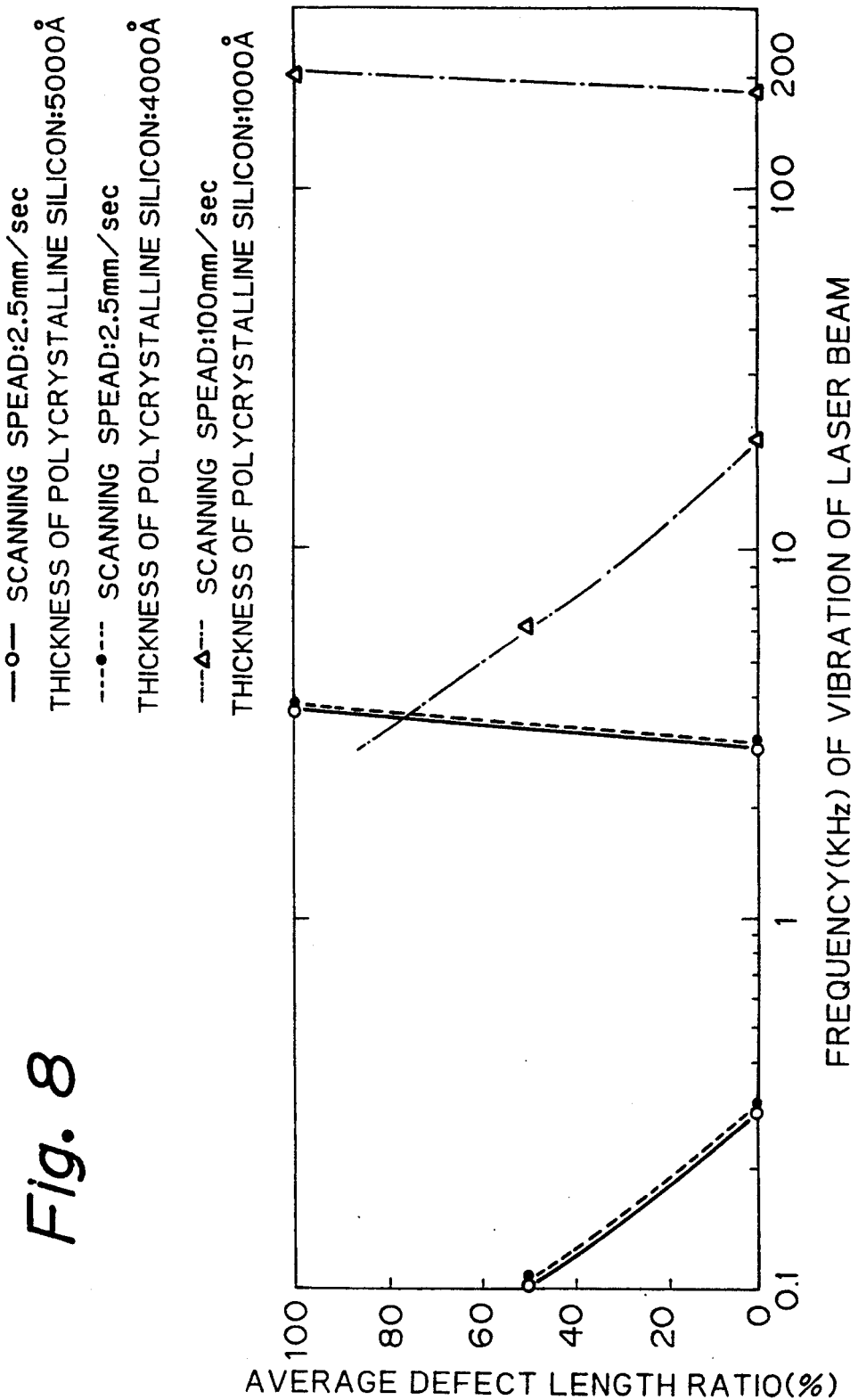

The relationship between the vibration frequency of the laser beam and the average defect length ratio, observed when the scanning speed is adjusted to 2.5 mm/sec, i.e., the lowest scanning speed and the thickness of polycrystalline silicon is 5000 Å, e.g., the largest thickness, the same relationship observed when the scanning speed is 2.5 mm/sec and the thickness of polycrystalline silicon is 4000 Å, and the same relationship observed when the scanning speed is 100 mm/sec, i.e., the highest scanning speed and the thickness of polycrystalline silicon is 1000 Å, e.g., the smallest thickness, are shown in FIG. 8. From the results shown in FIG. 8, it is seen that the minimum frequency giving an average defect length ratio of 0 is 290 Hz, obtained where the scanning speed is 2.5 mm/sec and the thickness of crystalline silicon is 5000 Å, and the maximum frequency giving an average defect length ratio of 0 is 180 KHz obtained where the scanning speed is 100 mm/sec and the thickness of polycrystalline silicon is 1000 Å. Accordingly, if the frequency of the vibration of the laser beam is selected from the range of from 290 Hz to 180 KHz, a good single crystal layer is formed. Note, the frequency range giving an average defect length of 0 is not substantially different where the scanning speed is 2.5 mm/sec and the thickness of polycrystalline silicon is 5000 Å and where the scanning speed is 2.5 mm/sec and the thickness of polycrystalline silicon is 4000 Å.

Figure 9:
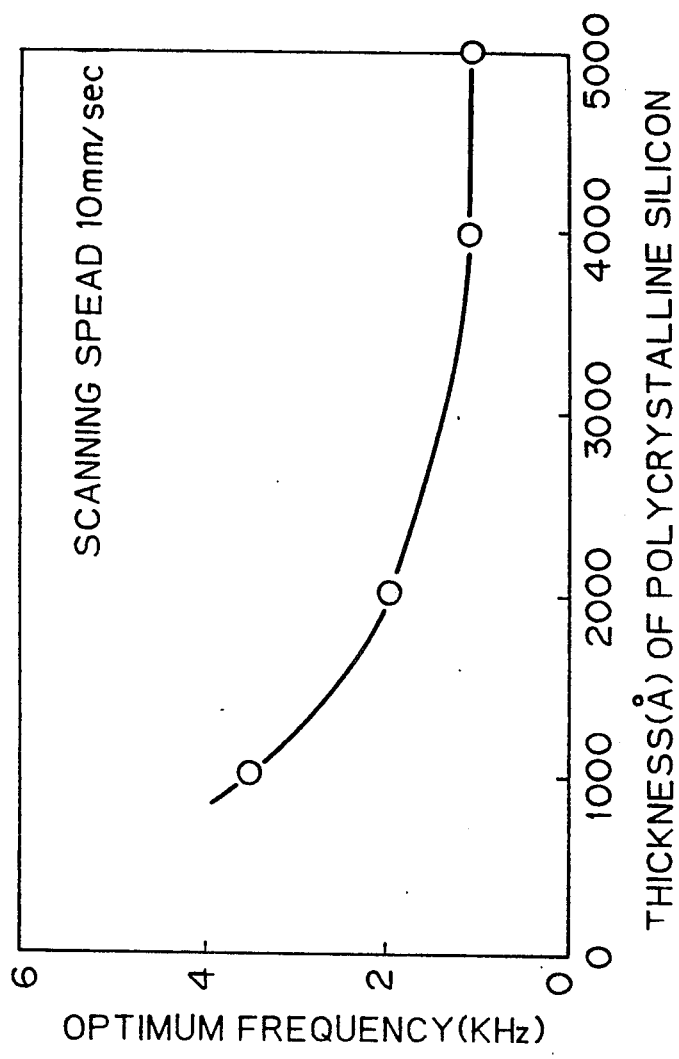
FIG. 9 is a diagram illustrating a relationship between the thickness of polycrystalline silicon and the optimum frequency; and, FIG. 10 is a diagram illustrating a relationship between the scanning speed and the optimum frequency.
Figure 10:
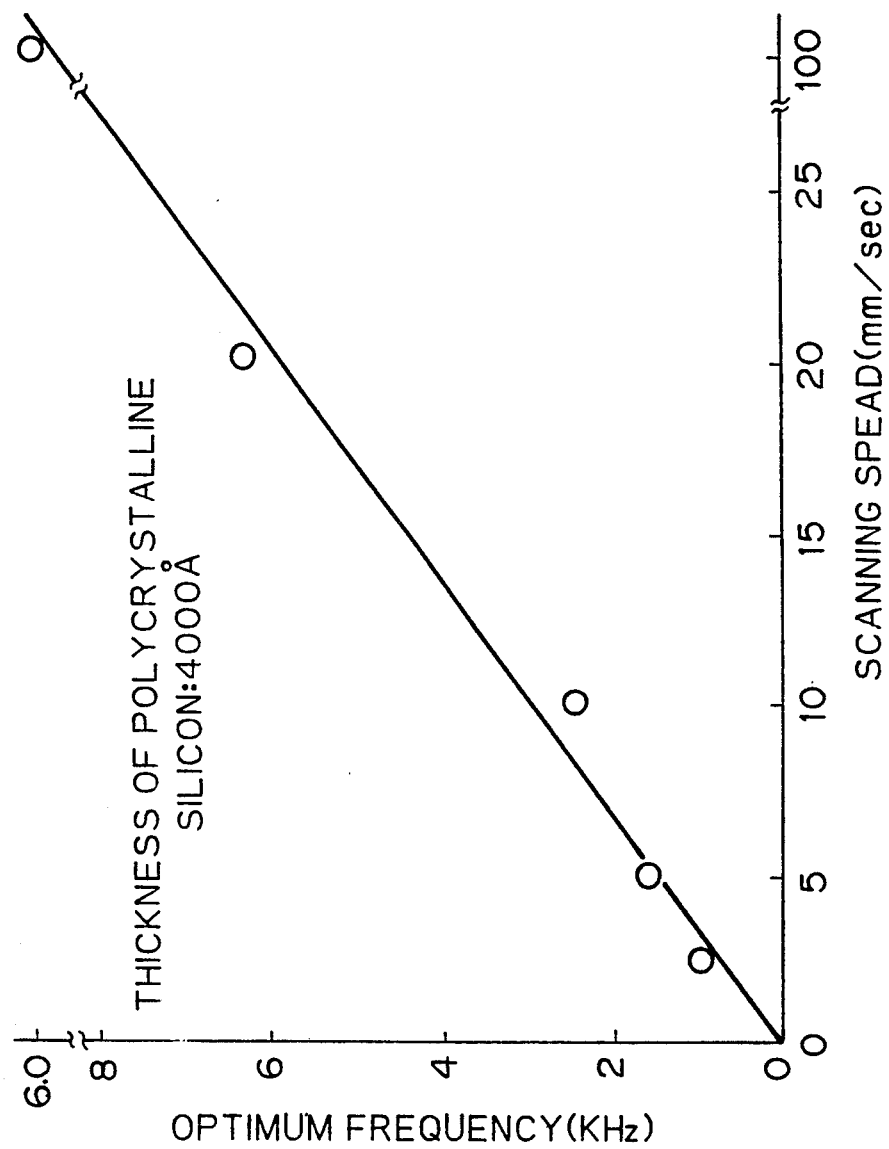

Assuming that the square root of the product of the lowest value ($f_L$) and highest value ($f_H$) of the range giving an average defect length ratio of 0 is regarded as the optimum frequency ($f_A = \sqrt{f_L \times f_H}$), if the scanning speed is 10 mm/sec, the relationship between the thickness of polycrystalline and the optimum frequency is as shown in FIG. 9, and if the thickness of polycrystalline silicon is 4000 Å, the relationship between the scanning speed and the optimum frequency is as shown in FIG. 10. It is seen that the optimum frequency is not different where the thickness of polycrystalline silicon is 4000 Å and where the thickness of polycrystalline silicon is 5000 Å, and that as the scanning speed is increased, the optimum frequency is also increased.

In the foregoing embodiments, the laser beam is used as the energy beam, but in the present invention, an energy beam other than the laser beam can be used. For example, even if the conversion to a single crystal is carried out by using an electron beam, an effect similar to the effect obtained by the laser beam can be obtained. Where an electron beam is used, a deflecting coil is disposed as the beam-vibrating means between an electron beam source and a substrate to be treated.

Furthermore, in the present invention, $Si_3N_4$ or SiON can be used instead of $SiO_2$ as the insulating film disposed below the polycrystalline semiconductor, or a multi-layer film comprising an appropriate combination of $SiO_2$, $Si_3N_4$ and SiON can be used. According to the present invention, a single crystal semiconductor layer having a good quality can be continuously formed over a broad region while controlling peeling.

Where the process of the present invention is applied to the practical preparation of an SOI substrate, it is of course necessary that the scanning should be carried out so that the peripheral portions of energy beams scanning along adjacent scanning lines overlap each other. In the present invention, a part of a polycrystalline semiconductor to be converted to a single crystal may be in contact with the surface of the substrate.

As apparent from the foregoing description, the occurrence of peeling of the melted semiconductor from the insulating film can be controlled, and a single crystal layer can be formed on the insulating film at a high treatment efficiency by using high energy beams. Furthermore, the melting width can be broadened by using high energy beams and formation of many grain boundaries can be prevented, and a single crystal having a better quality can be obtained.

We claim:

1. A process for recrystallizing a semiconductor layer, comprising the steps of:
    forming a polycrystalline semiconductor layer on a substrate;
    scanning an energy beam on said semiconductor layer in a direction of advance while vibrating said energy beam substantially in parallel with said direction of advance of scanning of said energy beam;
    wherein said polycrystalline semiconductor layer is composed of silicon; and
    wherein the power density of said energy beam is at least $10^6$ W/cm², said polycrystalline semiconductor has a thickness which is in a range of 1000 Å to 5000 Å, and wherein said energy beam has a vibration frequency which is in a range of 290 Hz to 180 KHz.

2. A process according to claim 1, wherein said energy beam is a laser beam.

3. A process according to claim 2, wherein the amplitude of the vibrations of said laser beam is within a range of ±(20 to 50) μm relative to a central position of said laser beam.

4. A process according to claim 1, wherein said energy beam is an electron beam.

5. A process according to claim 1, wherein said substrate is formed on an insulating body.

6. A process according to claim 5, wherein said insulating body is composed of $SiO_2$ or SiN.

7. A process according to claim 5, wherein said substrate is composed of Si.

8. A process according to claim 1, wherein upon cooling of said polycrystalline semiconductor layer a recrystallized semiconductor area is formed, and further comprising the step of forming an electronic device on said recrystallized semiconductor area.

9. A process for recrystallizing a semiconductor layer, comprising the steps of:
    forming a polycrystalline semiconductor layer on a substrate;
    scanning an energy beam on said semiconductor layer in a direction of advance while vibrating said energy beam substantially in parallel with said direction of advance of scanning of said energy beam so as to melt said polycrystalline semiconductor layer, said scanning and vibrating of said energy beam being conducted at a rate such that, upon cooling of said polycrystalline semiconductor layer, peeling of said polycrystalline semiconductor layer away from said substrate is substantially completely prevented without a reduction of treatment efficiency;
    wherein said polycrystalline semiconductor layer is composed of silicon; and
    wherein the power density of said energy beam is at least $10^6$ W/cm², said polycrystalline semiconductor has a thickness which is in a range of 1000 Å to 5000 Å, said energy beam has a vibration frequency which is in a range of 290 Hz to 180 KHz; and wherein the average defect length ratio is 0.

10. A process according to claim 9, wherein said energy beam is a laser beam.

11. A process according to claim 9, wherein the amplitude of the vibrations of said laser beam is within a range of ±(20 to 50) μm relative to a central position of said laser beam.

* * * * *